United States Patent
Xiao et al.

(10) Patent No.: US 7,108,806 B2
(45) Date of Patent: Sep. 19, 2006

(54) CONDUCTIVE MATERIALS WITH ELECTRICAL STABILITY AND GOOD IMPACT RESISTANCE FOR USE IN ELECTRONICS DEVICES

(75) Inventors: Yue Xiao, Belle Mead, NJ (US); Sun Hee Lehmann, Hillsborough, NJ (US); Chih-Min Cheng, Westford, MA (US); Gunther Dreezen, Olmen (BE)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 552 days.

(21) Appl. No.: 10/377,988

(22) Filed: Feb. 28, 2003

(65) Prior Publication Data

US 2004/0169162 A1    Sep. 2, 2004

(51) Int. Cl.
*H01B 1/22* (2006.01)
*H01L 23/48* (2006.01)
*C09K 3/00* (2006.01)

(52) U.S. Cl. ............ 252/511; 252/514; 252/502; 525/523; 525/526; 525/486

(58) Field of Classification Search ............ 252/511, 252/512, 514, 518.1, 502; 525/523, 526, 525/486
See application file for complete search history.

(56) References Cited

U.S. PATENT DOCUMENTS

| | | | | |
|---|---|---|---|---|
| 5,017,675 A | * | 5/1991 | Marten et al. ............ | 528/111 |
| 5,183,593 A | * | 2/1993 | Durand et al. ............ | 252/514 |
| 5,567,782 A | * | 10/1996 | Marten et al. ............ | 525/523 |
| 5,717,054 A | * | 2/1998 | Schultz ..................... | 528/100 |
| 5,891,367 A | | 4/1999 | Basheer et al. | |
| 5,929,141 A | | 7/1999 | Lau et al. | |
| 6,114,413 A | | 9/2000 | Kang et al. | |
| 6,344,157 B1 | | 2/2002 | Cheng et al. | |

FOREIGN PATENT DOCUMENTS

| | | |
|---|---|---|
| EP | 0 658 583 | 12/1994 |
| EP | 0 658 584 | 12/1994 |
| EP | 0 747 371 | 12/1996 |
| EP | 032038 A2 * | 2/2000 |
| EP | 1 231 248 | 8/2002 |
| WO | WO 02/089152 | 11/2002 |
| WO | WO 03/078163 | 9/2003 |

OTHER PUBLICATIONS

Lu, Daoqiang et al.: "Development of High Performance Surface Mount Conductive Adhesives"; Elec. Components and Tec. Conf.; 2000 IEEE.

(Continued)

*Primary Examiner*—Charles Boyer
*Assistant Examiner*—Kallambella Vijayakumar
(74) *Attorney, Agent, or Firm*—Charles W. Almer

(57) ABSTRACT

A composition that comprises a) an admixing of at least one epoxy resin and aliphatic amine wherein the ratio of epoxy function group/amine is greater than 1; b) a conductive filler; c) one or more corrosion inhibitors, oxygen scavengers or both; d) imidazole as a curing agent/catalyst; and e) optionally other additives such as organic solvents, flow additives, adhesion promoters and rheology modifiers. The reaction of epoxy and aliphatic amine with excess epoxy functionality results in a flexible resin with remaining active epoxy groups. The compositions exhibit improved electrical stability and impact resistance over other conductive adhesive compositions that do not comprise the admixture.

14 Claims, 2 Drawing Sheets

OTHER PUBLICATIONS

Lu, Daoqiang et al.: "Mechanisms Underlying the Unstable Contact Resistance of Conductive Adhesives".

Tong, Quinn K. et al.: "Conductive Adhesives with Stable Contact Resistance And Superior Impact Performance".

* cited by examiner

CONDUCTIVE MATERIALS WITH ELECTRICAL STABILITY AND GOOD IMPACT RESISTANCE FOR USE IN ELECTRONICS DEVICES

FIELD OF THE INVENTION

This invention relates to compositions that are suitable for use as conductive materials in microelectronic devices or semiconductor packages to provide electrically stable interconnections.

BACKGROUND OF THE INVENTION

Conductive compositions are used for a variety of purposes in the fabrication and assembly of semiconductor packages and microelectronic devices. For example, conductive adhesives are used to bond integrated circuit chips to substrates (die attach adhesives) or circuit assemblies to printed wire boards (surface mount conductive adhesives).

The leading technique used throughout the electronics industry for soldering components to the substrate uses a metallic solder alloy which is so called eutectic solder containing by weight 63% tin and 37% lead. It is applied to the circuit board as a paste which is heated to above its melting temperature (183° C.) to let solder paste melt and form joint. Alternatively, the board is passed over a molten wave of solder to form joints to bond the electrical components to the circuit board. In either case, a flux material is used to remove surface oxidation from metallic surfaces and allow the molten solder to strongly bond to the surfaces and form reliable solder joints with excellent impact resistance. While the solder technology has existed for many decades, it has several shortcomings. Lead in the alloy is not environmental friendly. Numerous environmental regulations have been proposed to tax, limit, or ban the use of lead in the electronic solders. Secondly, high process temperature requires to use more expensive thermo-stable substrate and does not fit flexible substrate that becomes more popular in the electronic industry. Another shortcoming is extra step to clean up the residue from flux material after reflow process which is an expensive and inefficient process.

Conductive adhesives offer several advantages over traditional solder assembly due to the absence of lead, low processing temperatures and a simplified assembly process that does not require solder flux and subsequent flux cleaning steps. Among the desired properties of conductive adhesives are long work life at room temperature, relatively low curing temperature and relatively short curing time, good rheology for screen printing, sufficient conductivity to carry an electric current when cured, acceptable adhesion to the substrate when cured, stable electrical resistance at high temperature and humidity over long periods of time, and good impact strength.

Previous testing of commercially available adhesives has concluded that conductive adhesives are suitable for only niche applications due to the limitation by resistance and impact requirements. Some vendor claimed success at develop an impact resistance adhesive and some vendor claim success at stable contact resistance. But none of them has been successful to achieve both impact resistance and stable contact resistance, especially with tin/lead surface. In fact, many adhesive vendors have acknowledged that impact strength and resistance stability are mutually exclusive parameters.

Two conductors with dissimilar electrochemical potentials will form an electrochemical cell in the presence of water. The conductors act as cathode and anode, and environmental humidity provides the necessary aqueous medium to bridge the anode and cathode. The metal with the lower electrochemical potential acts as the anode resulting in the loss of electrons $\{M-ne \rightarrow M^{n+}\}$ and the corrosion of the metal. The metal with the higher electrochemical potential acts as the cathode $\{2H_2O+O_2+4e \rightarrow 4OH^-\}$. Oxygen is involved in this mechanism but does not directly react with the anode metal. The metal ion $M^{n+}$ will combine with $OH^-$ and form a metal hydroxide that stabilizes by developing into a metal oxide, which over time forms on the anode surface. Metal oxides in general are non-conductive, the result being a decrease in conductivity of the metal circuitry.

The problem is less acute when the filler in the composition is the same metal as the contiguous circuitry or the substrate. Thus, a semiconductor package using a conductive composition, one comprising an epoxy resin and silver filler, for example, will not be as susceptible to electrochemical failure when a silver-filled composition is used on a silver substrate. However, if the composition is used on a nickel-plated substrate, electrochemical corrosion will result under high humidity conditions.

These compositions, however, are vulnerable to environmental conditions, and high temperature and high humidity can cause the electrical resistance of the assembly fabricated with these compositions to increase substantially over time. The suspected mode of failure is electrochemical corrosion of the circuitry at the interface of the conductive filler in the composition with another contiguous metal surface, for example, a metal lead frame or other circuitry.

Another vulnerability of the compositions is their resistance to impact when the packaging containing the composition is dropped or struck. Most conductive adhesives are often thought as high Tg rigid materials. This rigidity will prevent effectively dissipate mechanical energy at impact test temperature, i.e. ambient temperature. Thus conductive adhesive cracks or component falls off from substrate when the whole packages drop from height. With high filled conductive filler, the impact resistance of conductive adhesives becomes even worse.

It would be an advantage, therefore, to provide conductive materials that form electrically stable assemblies for use in semiconductor packaging operations. It would also be advantageous to provide a conductive adhesive which would provide improved contact resistance when exposed to harsh environmental conditions and subjected to an impact. At the same time, it is important that the adhesive have a relatively long shelf life.

SUMMARY OF THE INVENTION

Figure 1:
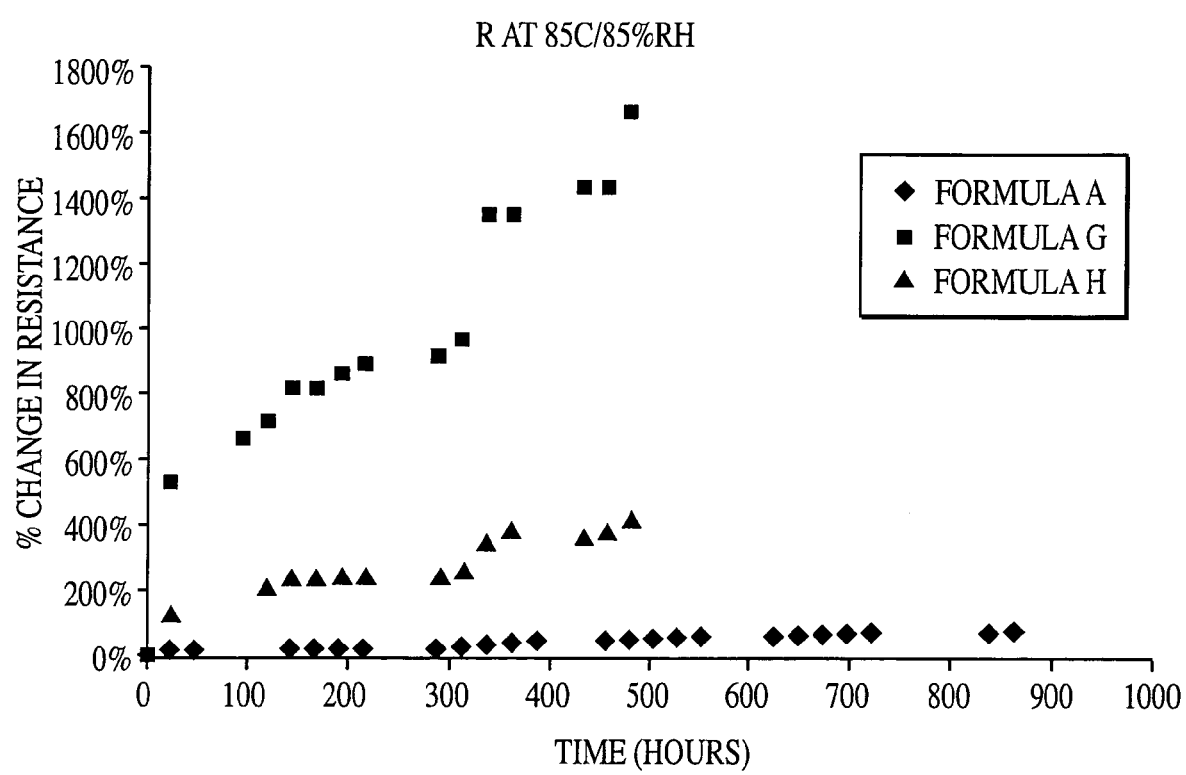
FIG. 1 is an illustration of the change in contact resistance over time for three conductive adhesive formulations.

This invention is a composition that comprises a) an admixing of at least one epoxy resin and aliphatic amine wherein the ratio of epoxy function group/amine is greater than 1; b) a conductive filler; c) one or more corrosion inhibitors, oxygen scavengers or both; d) imidazole as a curing agent/catalyst; and e) optionally other additives such as organic solvents, flow additives, adhesion promoters and rheology modifiers. The pre-reaction of epoxy and aliphatic amine with excess epoxy functionality results in a prepolymer with a flexible structure and remaining active epoxy groups. The compositions exhibit improved electrical stability and impact resistance and more stable shelf life over other conductive adhesive compositions that do not comprise the admixture. The admixture will be present in an amount in the range of 10 to 90 weight percent; the filler in an amount of about 30 to 90 weight percent; the corrosion inhibitors and/or oxygen scavengers will be present in an amount of no more than 10 weight percent (but not 0%); the curing agent will be present in an amount of no more than 10 weight percent (but not 0%); the organic solvent will be present in an amount up to 50 weight percent; and the optional ingredients will be present in an amount of no more than 10 weight percent, for a total of 100 weight percent.

DETAILED DESCRIPTION OF THE INVENTION

Conductive adhesives commonly have consisted of phenolic resin, an epoxy resin, or a mixture of resins. By incorporating the combination of resin and other ingredients, such as primary amine, imidazole as catalyst, and 8-hydroxyquinoline as corrosion inhibitor, of the present invention the resulting conductive adhesives provides advantageous electrical stability and impact resistance. In addition, the conductive adhesive of the present invention has good screen printability, good shelf life, low curing temperature, low contact resistance, and good adhesion to a copper substrate.

The conductive adhesive of the present invention comprises a) an admixing of at least one epoxy resin and aliphatic amine wherein the ratio of epoxy function group/amine is greater than 1; b) a conductive filler; c) one or more corrosion inhibitors, oxygen scavengers or both; d) imidazole as a curing agent/catalyst; and e) optionally other additives such as organic solvents, flow additives, adhesion promoters and rheology modifiers. The pre-reaction of epoxy and aliphatic amine with excess epoxy functionality results in a prepolymer with a flexible structure and remaining active epoxy groups. The ingredients are specifically chosen to obtain the desired balance of properties for the use of the particular resins.

The preferred epoxy resin for use with the present invention include monofunctional and multifunctional glycidyl ethers of Bisphenol-A and Bisphenol-F, aliphatic and aromatic epoxies, saturated and unsaturated epoxies, or cycloaliphatic epoxy resins or a combination thereof. Examples of aliphatic epoxy include Flex Epoxy 1.

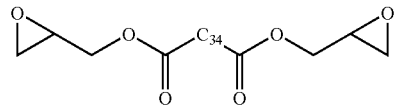

Flex Epoxy 1

Example of aromatic epoxies include RAS-1, RAS-5, and Flex Epoxy-3.

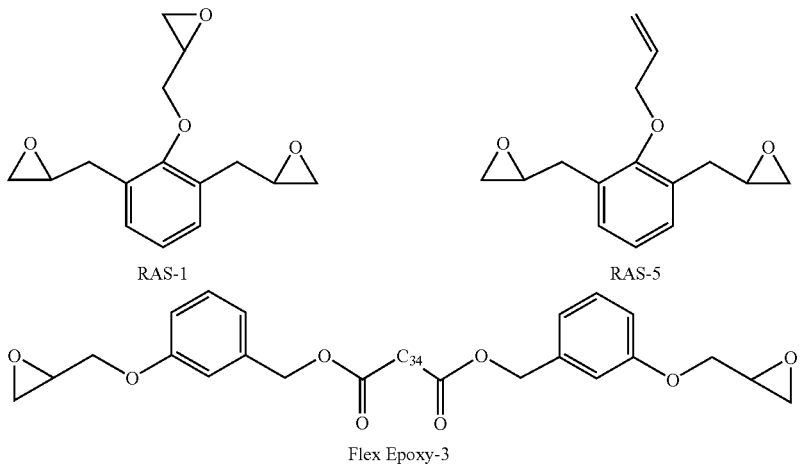

RAS-1

RAS-5

Flex Epoxy-3

Example of unsaturated epoxy includes Cardolite NC513.

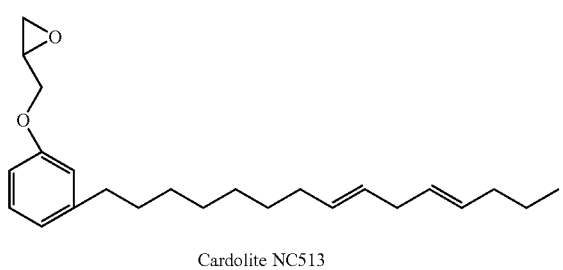

Cardolite NC513

Glycidyl ether epoxides are preferred in the invention, either separately or in combination with the non-glycidyl ether epoxides. A preferred epoxy resin of this type is bisphenol A resin. Another preferred epoxy is aliphatic epoxy including Flex-1 epoxy. A most preferred epoxy resin is bisphenol F type resin. These resins are generally prepared by the reaction of one mole of bisphenol F resin and two moles of epichlorohydrin. A further preferred type of epoxy resin is epoxy novolac resin. Epoxy novolac resin is commonly prepared by the reaction of phenolic resin and epichlorohydrin. Dicyclopentadiene-phenol epoxy resin, naphthalene resins, epoxy functional butadiene acrylonitrile copolymers, epoxy functional polydimethyl siloxane and mixtures thereof are additional types of epoxy resins which may be employed. Commercially available bisphenol-F type resin are available from CVC Specialty Chemicals, Maple Shade, N.J., under the designation 8230E and Resolution Performance Products Ltd. under the designation RSL1739. Bisphenol-A type epoxy resin is commercially available from Resolution Performance Products Ltd. as EPON 828, and a blend of bisphenol-A and bisphenol-F is available from Nippon Chemical Company under the designation ZX-1059.

The desired primary amine compound, such as polyoxypropylene diamine, is combined with epoxy resin with excess of epoxide function to produce the prepolymer with epoxy functional group terminated. Especially preferred primary amine is aliphatic amine, diamine or triamine. Commercially available examples of aliphatic amine is Jeffamine (Huntsman).

In addition to the resins, an imidazole is included in the conductive adhesive composition as a catalyst. Imidazole provides different properties to the conductive adhesives than the properties provided by other catalysts such as dicyanamide and tertiary amine. Preferred imidazoles that may be included in the composition include non-N-substituted imidazoles such as 2-phenyl-4-methyl imidazole, 2-phenyl imidazole and imidazole. Other useful imidazole components include alkyl-substituted imidazole, N-substituted imidazole and mixtures thereof.

The electrically conductive material may comprise conductive fillers. Exemplary conductive fillers are silver, copper, gold, palladium, platinum, carbon black, carbon fiber, graphite, aluminum, indium tin oxide, silver coated copper, silver coated aluminum, bismuth, tin, bismuth-tin alloy, metallic coated glass spheres, silver coated fiber, silver coated spheres and antimony doped tin oxide.

To counteract the formation of metal oxide, corrosion inhibitors are commonly utilized. A corrosion inhibitor is defined herein to be any chemical compound that has a lone pair of electrons, such as nitrogen-, sulfur-, and oxygen-containing compounds, that will bind with metal and impede the reactivity of the metal at the electrochemical anode. Exemplary corrosion inhibitors are 1,10-phenathiodine, phenothiazine, benzotriazole, benzimidazole, mercaptobenzothiazole, dicyandiamide, 3-isoprolyamino-1-butyne, propargyl quinolinium bromide, 3-benzylamino-1-butyne, dipropargl ether, dipropargyl thioether, propargyl caproate, dianimoheptane, phenathroline, amine, diamine, triamine, hexamethyleneimide, decamethyleneimide, hexamethyleneiminebenzoate, hexamethyleneimine-3,5-dinitrobenzoate, hexamethylenetetramin, d-oximino-b-vinyl quinuclidine, aniline, 6-N-ethyl purine, 1-ethylamino-2-octadecylimidazoline, morpholine, ethanolamine, aminophenol, 2-hydroxyquinoline, 6-hydroxyquinoline, 8-hydroxyquinoline, pyridine and its derivatives, quinoline and its derivatives, acridine, imidazole and its derivatives, toluidine, mercaptan, thiophenol and its derivates, sulfide, sulfoxide, thiophosphate, thiourea and piperidine.

Organic solvents are utilized as an option to substantially dissolve the resin system and to adjust the viscosity of the conductive adhesives in order to make the adhesive best suited to be screen printed and wet the component terminals. Solvents which may be utilized include γ-butyrolactone, glycidyl ethers, for example, 1,4-butanediol diglycidyl ether; vinyl ethers, for example, ethylene vinyl ether, and vinyl esters, for example, ethylene vinyl ester, and acrylates, for example, methyl methacrylate, diethyl glycol, monoethyl ether, diethylene glycol dimethylene ether, dibasic ester solvent, carbitol, carbitol acetate, butyl carbitol, butyl carbitol acetate, acetone, methyl ethyl ketone, cyclohexanoe, diethylene glycol monoethyl ether acetate, diethylene glycol monobutyl ether acetate and dipropylene glycol monomethyl ether. The most preferred solvent is γ-butyrolactone.

Optionally, suitable flow additives, adhesion promoters, conductivity additives, and rheology modifiers may be added as desired. Optional flow additives include silicon polymers, ethyl acrylate/2-ethylhexyl acrylate copolymers, alkylol ammonium salt of acid phosphoric acid esters of ketoxime or mixtures thereof. Suitable adhesion promoters include various forms of silane. Suitable rheology modifiers include thermoplastic resin and preferably polyvinyl acetal. Suitable conductivity additives include anhydride, glutaric acid, citric acid, phosphoric acid and other acid catalysts.

In another embodiment, this invention is a method of enhancing the impact strength of a conductive composition comprising the use of an admixture in the composition.

Applicants have discovered that an adhesive comprising an admixture of at least one epoxy resin and aliphatic amine in a ratio of epoxy functional group/aliphatic amine of greater than 1:1, and imidazole as a curing agent or catalyst will increase the impact strength of the adhesive. The conductive adhesive containing the admixture will have a better electrical stability, greater strength, and a longer shelf life than a conductive adhesive containing a physical mixing of the same or similar ingredients.

The adhesive composition of this embodiment of the invention contains up to about 10 to 90 weight percent of a resin admixture; about 30 to 90 weight percent of a conductive filler; about 0.1 to 10 weight percent of a corrosion inhibitor and/or oxygen scavenger; about 0.1 to 10 weight percent of imidazole as a catalyst; about 0 to 50 weight percent of an organic solvent; and about 0 to 5 weight percent of adhesion promoters, flow additives, rheology modifiers or other additives for a total of 100 weight percent. Preferably, the resin admixture is present in the range of about 10 to 60 weight percent, the conductive filler is present in the range of about 40 to 90 weight percent, the corrosion inhibitor and/or oxygen scavenger is present in the range of about 0.1 to 5 weight percent, the imidazole as catalyst is present in the range of about 1 to 5 weight percent, the organic solvent is present in the range of about 0 to 20 weight percent and the other additives are present in the range of about 0 to about 5 weight percent.

The invention can be further described by the following examples.

EXAMPLES

Example 1

Samples of a prepolymer and a physical blend of the epoxy-amine system were prepared. The physical blend of epoxy and amine (Component A) was made by mixing 55.56 weight percent of a mixture of Diglycidyl ether of bisphenol-A and Diglycidyl ether of Bisphenol-F (commercially available as ZS1059 from Tohto Kasei Co. and 44.44 weight percent of poly(oxy(methyl-1,2-ethanediyl)), alpha-(2-aminomethylethyl) ometa-2(2-aminomethlethoxy) (commercially available as Jeffamine ® D-2000 from Huntsman Petrochemical Co.) The prepolymer (Component B) was formed by heating the physical blend to 120° C. for 6 hours in a conventional oven. Components A and B were tested by an IR spectrum and Component B exhibited a peak at wavelength of 3439 cm$^{-1}$ which indicates the existence of a hydroxyl functional group in the sample. component A did not have a peak at wavelength 3439 cm$^{-1}$ which indicates that there is no hydroxyl functional group. A typical polymerization reaction of an amine and epoxy system results in the formation of linear chains with a hydroxyl functional group. The pre-polymer spectrums indicate this evidence.

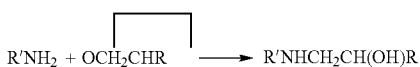

$$R'NH_2 + OCH_2CHR \longrightarrow R'NHCH_2CH(OH)R$$

peak at wavelength of 3439 cm$^{-1}$ in pre-polymer spectrum indicated the existence of hydroxyl functional group in the sample, but the physical blend did not (no peak at wavelength of 3439 cm$^{-1}$). The viscosities of Component A and B measured by a Brookfield viscometer. The viscosities are illustrated in table 1.

TABLE 1

Viscosities of Prepolymer and Physical Blend

| Time (hours) | Component A Viscosity (cPa) | Component A Change in Viscosity (%) | Component B Viscosity (cPa) | Component B Change in Viscosity (%) |
|---|---|---|---|---|
| 0 | 28.4 | 0 | 1495 | 0 |
| 7 | — | — | 1556 | 4 |
| 24 | — | — | 1720 | 15 |
| 48 | 70.7 | 149 | — | — |
| 72 | — | — | 2027 | 36 |
| 96 | 127.5 | 349 | — | — |

As shown in Table 1, the viscosity of the physical blend changed rapidly while the viscosity of the prepolymer did not. Thus, the prepolymer is more shelf stable and has a longer work life than the physical blend.

Example 2

The initial contact resistance of the conductive adhesives was tested via five different adhesive formulations containing epoxy-aliphatic amine prepolymer catalyzed by imidazole. The formulations were made by first dissolving Novolac 1166 in γ-butyrolactone at 120° C. The solution was cooled to room temperature and the remainder of the ingredients were added and thoroughly mixed by a mechanical mixer. The compositions of the formulations are set out in Table 2.

TABLE 2

Conductive Adhesives with Epoxy-Aliphatic Amine Prepolymer

| Ingredient | Formula A | Formula B | Formula C | Formula D | Formula E |
|---|---|---|---|---|---|
| Novolac 1166 | 0.72 | 0.72 | 0.61 | 0.61 | 0.72 |
| γ-butyrolactone | 5.62 | 5.62 | 4.75 | 4.75 | 5.62 |
| Component B | 14.06 | 14.06 | 11.78 | 11.88 | 14.06 |
| 4-methyl-2 phenylimidazole | 0.72 | 0.72 | 0.60 | 0.60 | 0.72 |
| 8-hydroxyquinoline | 1.30 | 1.30 | 1.10 | 1.10 | 1.30 |
| BYK-W9010 | 0.07 | 0.07 | 0.06 | 0.06 | 0.07 |
| Adipic Acid | — | — | — | — | 0.03 |
| Silver SF-98 | 77.51 | — | — | — | — |
| Silver SF-W | — | 77.52 | — | — | — |
| Silver SF-80 | — | — | 81.0 | — | — |
| Silver SF-84 | — | — | — | 81.0 | — |
| Silver SF-85HV | — | — | — | — | 77.48 |

The formulated adhesive was stenciled onto either a ceramic or a FR-4 board and resistors (0805 null ohm) were placed on top of the adhesive. The entire FR-4 board was cured at 150 C and the entire ceramic board was cured at 175C for one hour. After the board was cooled to room temperature the initial contact resistance was measured by four-point probe of a Keithley 2010 multimeter. The results of the initial resistance are illustrated in Table 3.

TABLE 3

Initial Resistance of Conductive Adhesives

| | Formula A | Formula B | Formula C | Formula D | Formula E |
|---|---|---|---|---|---|
| Resistance (mΩ) | 24 | 26 | 22 | 24 | 22 |

As shown in Table 3, the conductive adhesives containing the prepolymer all have an acceptable initial resistance.

Similarly, a conductive adhesive was formed with Bisphenol-A/Bisphenol-F epoxy and flexible epoxy and another conductive adhesive was formed without the flexible epoxy. To formulate these adhesives, the ingredients were mixed together and the silver was then added and mixed with a mechanical mixer. The formulations and their initial resistances are shown in Table 4

TABLE 4

Bis-A/Bis-F Epoxy with Initial Resistance

| Ingredient | Formula O | Formula F |
|---|---|---|
| ZX 1059 | 19.32 | 4.95 |
| Flex Epoxy 1 | 0 | 14.37 |
| BYK A187 | 0.2 | 0.2 |
| Curpen | 2.48 | 2.48 |
| 2-ethyl, 4-methyl-imidazole CN | 0.99 | 0.99 |
| 8-hydroxinoline | 1.8 | 2.68 |
| Silver SF-98 | 74.33 | 74.33 |
| Resistance (mΩ) | 22 | 56 |

Example 3

Two additional samples were prepared in the same manner as the samples in Example 2 and their formulations are shown in Table 5.

TABLE 5

Conductive Adhesives with Different Catalysts and Corrosion Inhibitors

| Ingredient | Formula G | Formula H |
|---|---|---|
| Novolac HT 9490 | 0.72 | 0.72 |
| BCaA | 6.0 | 6.0 |
| Component B | 14.39 | 14.39 |
| Dyhard 100S | 1.21 | 1.21 |
| HEKARM/diuron | 0.61 | 0.61 |
| 8-hydroquinoline | — | 2.72 |
| BYK-A1120 | 0.08 | 0.08 |
| Silver SF-96 | 76.99 | 76.99 |

After the samples were formulated and placed on the boards, the initial contact resistance was measured. The boards were then placed into a humidity chamber that remained at 85° C. and 85% relative humidity and the contact resistance was measured periodically by a Keithley 2010 multimeter. As shown in FIG. 1, the resistance values changed more significantly for the samples without any corrosion inhibitor. Also, the resistance is much more stable under high temperature and high humidity conditions when imidazole is utilized as the catalyst and when the corrosion inhibitor is incorporated into the formulation.

Example 4

Samples of conductive adhesives formulated as per Example 2 were stenciled onto a 3"×1.5" bare copper board. The dimension of the stencil was 25×25×0.33 mm. A dummy lead chip (PLCC) was then placed on top of the stenciled adhesive and the entire board was heated at 175C for one hour. The board was cooled to room temperature, the drop performance was evaluated by dropping the entire chip-adhesive-board assembly from either 36" or 60" onto a hard surface inside a tube. The tube ensured that the assembly remained in a vertical position and maintained its position as it contacted the hard surface. The results of the drop tests are listed in Table 6.

TABLE 6

Drop Performance

| System | O | O | A (with Component A) | A (with Component B) | B | C | D | E | F |
|---|---|---|---|---|---|---|---|---|---|
| # drops before failure @ 36" | 0 | 2 | 3 | 6+ | 6+ | 6+ | 6+ | 6+ | 6+ |
| # drops before failure @ 60" | 0 | 0 | 1 | 4–5 | 5–6 | 4 | 4 | 4 | 4 |
| Adhesive avg thickness (mil) | 6 | 13.3 | 12 | 7.13 | 7.09 | 7.36 | 7.72 | 9.25 | 11 |

As shown in Table 6, the conductive adhesives containing the flexible epoxy or aliphatic amine have superior drop test performance than adhesives without those ingredients. Likewise, the drop test of the component having an adhesive with a physical blend of the epoxy and amine did not produce a satisfactory result. The components having an adhesive using the prepolymer produced superior results than adhesives without those components.

Example 5

The performance of the adhesive as cured at different temperatures was tested under varying temperature and humidity conditions. Formula A with the prepolymer was utilized in two assemblies, one of which was cured at 150C and one of which was cured at 175C. The results of the drop test of those samples in shown in Table 7.

TABLE 7

Drop Test Results With Variable Cure Temperatures

| Formula A | 175 C. Cured | 150 C. Cured |
|---|---|---|
| # drops before failure @ 36" | 6+ | 6+ |

TABLE 7-continued

Drop Test Results With Variable Cure Temperatures

| Formula A | 175 C. Cured | 150 C. Cured |
|---|---|---|
| # drops before failure @ 60" | 4–5 | 3 |
| Avg. Thickness of Adhesive (mil) | 7.13 | 7.60 |

Figure 2:
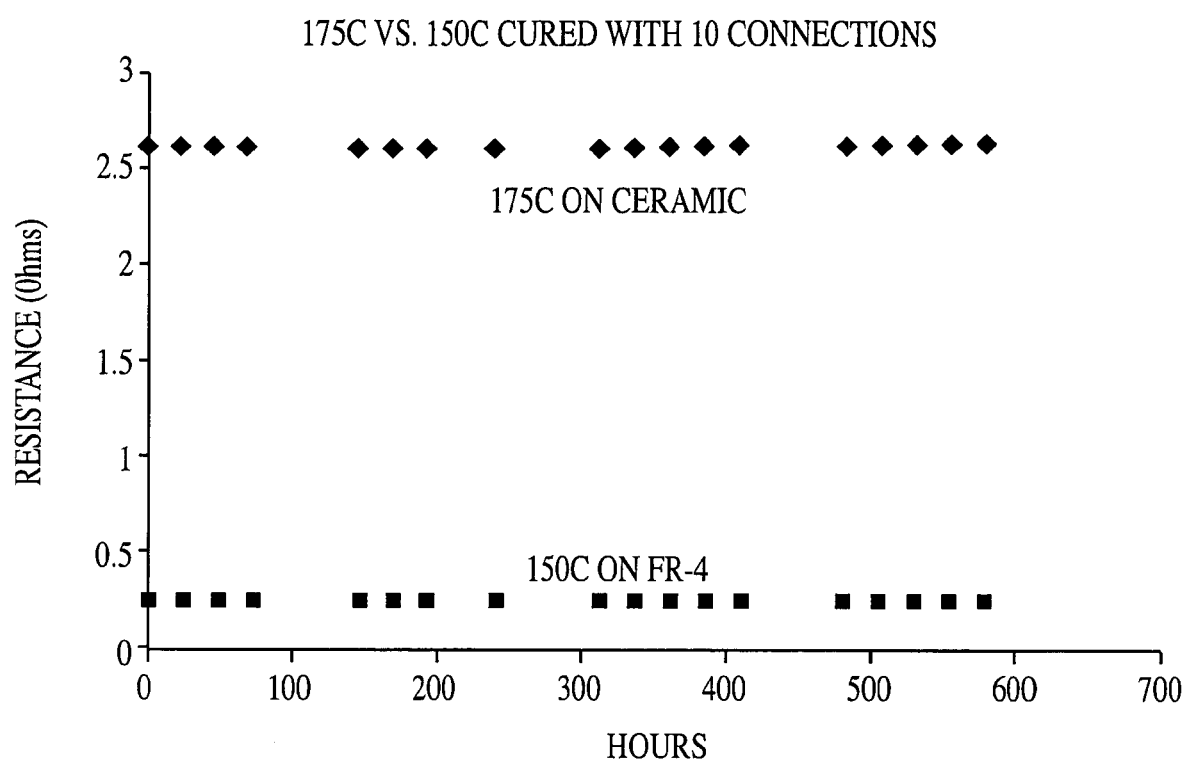
FIG. 2 is an illustration of the contact resistance change over time for adhesive subjected to 85C/85% relative humidity.

To test the stability with curing at different temperatures, adhesive was placed on a FR-4 board and cured at 150C and on a ceramic substrate and cured at 175C. Both of the assemblies were placed in a humidity chamber and stored at 85C/85% relative humidity. The resistances for both samples are they were removed from the chamber are shown in FIG. 2. As shown in FIG. 2, the contact resistance does not vary under extreme conditions and is not dependent upon the curing temperature.

Example 6

The specimens with electrical components set out in Example 2 were placed on FR-r4 boards and subjected to a die shear test. The die shear test illustrates the adhesion strength of the conductive adhesive on a copper substrate. Royce 552 die automatic die shear tester was used. All experiments were conducted at room temperature. The components on the substrate is 0204 null resistor with Tin/Lead terminal. The automatic moving tip from die shear tester pushes out the component on the substrate and maximal force is recorded as die shear strength. The results are shown in Table 8.

TABLE 8

Adhesion Strength of Conductive Adhesives

| | Sample | | | | | |
|---|---|---|---|---|---|---|
| | A | B | C | D | E | F |
| Die Shear Strength (kgF) | 2.9 | 2.6 | 2.8 | 3.1 | 3.0 | 1.1 |

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

What is claimed is:

1. A composition for use in microelectronic devices comprising
   (a) a thermally curable resin system comprising an admixture of at least one epoxy resin and aliphatic amine, wherein said epoxy and the said amine have been pre-blended to form said admixture,
   (b) a conductive filler,
   (c) a corrosion inhibitor,
   (d) a curing agent or catalyst,
   (e) optionally, an organic solvent, and
   (f) optionally, one or more of the group consisting of adhesion promoters, phenolic resin, flow additives and rheology modifiers, wherein the ratio of epoxide functional group in the epoxy resin to the amine functional group in the aliphatic amine is greater than 1.

2. The composition according to claim 1 in which
   (a) the admixture is present in an amount of about 10 to about 90 weight percent;
   (b) the conductive filler is present in an amount of about 30 to about 90 weight percent;
   (c) the corrosion inhibitor is present in an amount up to about 10 weight percent (but not 0%),
   (d) the curing agent or catalyst is present in an amount of a ratio of curing agent to resin of no greater than about 10 weight percent but not 0);
   (e) the organic solvent is present in an amount of about 0 to about 10 weight percent, and
   (f) the one or more of the group consisting of adhesion promoters, flow additives and rheology modifiers are present in an amount from about 0 to about 5 weight percent. for a total of 100 weight percent.

3. The composition according to claim 2 wherein the resin is present in an amount of from about 10 to about 60 weight percent.

4. The composition according to claim 2, wherein the curing agent is present in an amount of from about 1 to about 5 weight percent.

5. The composition according to claim 2, wherein the corrosion inhibitor is present in an amount of from about 0.1 to about 5 weight percent.

6. The composition according to claim 2, wherein the conductive filler is present in an amount of about 40 to about 90 weight percent.

7. The composition according to claim 1 in which the conductive filler is selected from the group consisting of silver, copper, gold, palladium, platinum, carbon black, bismuth, tin, bismuth-tin alloy, carbon fiber, graphite, aluminum, indium tin oxide, silver coated copper, silver coated aluminum, metallic coated glass spheres, silver coated fiber, silver coated spheres, antimony doped tin oxide or mixtures thereof.

8. The composition according to claim 7, wherein the conductive filler is silver.

9. The composition according to claim 1, wherein the admixture comprises in the range of about 20 to about 100 weight percent epoxy resin, in the range of about 0 to about 99 weight percent of the chemically equivalent amount of the epoxide content in epoxy resin of aliphatic amine, and in the range of about 0.1 to about 10 weight percent of a cross-linking agent.

10. The composition according to claim 1, wherein the resins are selected from the group of monofunctional and multifunctional glycidyl ethers of Bisphenol A and Bisphenol F, aliphatic and aromatic epoxies, saturated and unsaturated epoxies, or cycloaliphatic epoxy resins, or mixtures thereof.

11. The composition according to claim 1, wherein the corrosion inhibitor is selected from the group consisting of ,10-phenathiodine, phenothiazine, benzotriazole, benzimidazole, mercaptobenzothiazole, dicyandiamide, 3-isoprolyamino-1-butyne, propargyl quinolinium bromide, 3-benzylamino-1-butyne, dipropargi ether, dipropargyl thioether, propargyl caproate, dianimoheptane, phenathroline, amine, diamine, triamine, hexamethyleneimide, decamethyleneimide, hexamethyleneiminebenzoate, hexamethyleneimine-3,5-dinitrobenzoate, hexamethylenetetramin, d-oximino-b-vinyl quinuclidine, aniline, 6-N-ethyl purine, 1-ethylamino-2-octadecylimidazoline, morpholine, ethanolamine, aminophenol, 2-hydroxyquinoline, 6-hydroxyquinoline, 8-hydroxyquinoline, pyridine and its derivatives, quinoline and its derivatives, acridine, imidazole and its derivatives, toluidine, mercaptan, thiophenol and its derivates, sulfide, sulfoxide, thiophosphate, thiourea and piperidine.

12. The composition of claim 11, wherein the corrosion inhibitor is 8-hydroxyquinoline.

13. The composition of claim 1, wherein the organic solvent is one or more of the group comprising glycidyl ethers, 1,4-butanediol diglycidyl ether; vinyl ethers, ethylene vinyl ether, vinyl esters, ethylene vinyl ester, acrylates, methyl methacrylate, and butyl carbitol.

14. The composition of claim 1, wherein the catalyst or curing agent is imidazole.

* * * * *